United States Patent [19]
Kato

[11] Patent Number: 5,532,184
[45] Date of Patent: Jul. 2, 1996

[54] METHOD OF FABRICATING A SEMICONDUCTOR DEVICE USING QUANTUM DOTS OR WIRES

[75] Inventor: Yoshimine Kato, Sagamihara, Japan

[73] Assignee: International Business Machines Corporation, Armonk, N.Y.

[21] Appl. No.: 523,829

[22] Filed: Sep. 6, 1995

Related U.S. Application Data

[62] Division of Ser. No. 172,446, Dec. 22, 1993, Pat. No. 5,479,027.

[51] Int. Cl.$^6$ .................................................. H01L 21/20
[52] U.S. Cl. .......................... 437/133; 437/107; 437/126; 257/189; 257/192
[58] Field of Search ....................................... 437/107, 126, 437/129, 133; 257/189, 192

[56] References Cited

U.S. PATENT DOCUMENTS

| | | | |
|---|---|---|---|
| 4,872,038 | 10/1989 | Bernestein et al. | 437/129 |
| 5,244,828 | 9/1993 | Okada et al. | 437/133 |
| 5,281,543 | 1/1994 | Fukuzawa et al. | 437/133 |
| 5,313,484 | 5/1994 | Arimoto | 437/129 |

FOREIGN PATENT DOCUMENTS 62-134978 of 0000 Japan.

OTHER PUBLICATIONS

Y. Hirayama et al., "Fabrication of a GaAs quantum-well-wire structure by Ga focused-ion-beam implantation and its optical properties", Physical Review B, vol. 37, No. 5, 15 Feb. 1988-I.

H. Temkin et al., "Low-temperature photoluminescence from InGaAs/InP quantum wires and boxes", Appl. Phys. Lett. 50 (7), 16 Feb. 1987.

T. Fukui et al., "GaAs tetrahedral quantum dot structures fabricated using selective area metalorganic chemical vapor deposition", Appl. Phys. Lett. 58 (18), 6 May 1991.

F. Wakaya et al., "Fabrication of GaAs/GaAlAs quantum wires with side gates", J. Vac. Sci. Technol. B 8 (6), Nov./Dec. 1990.

Y. Arakawa et al., "Quantum Well Lasers–Gain, Spectra, Dynamics", IEEE Journal of Quantum Electronics, vol. QE–22, No. 9, Sep. 1986.

M. Asada et al., "Gain and the Threshold of Three–Dimensional Quantum–Box Lasers", IEEE Journal of Quantum Electronics, vol. QE–22, No. 9, Sep. 1986.

Hiroyuki Sakaki, "Scattering Suppression and High–Mobility Effect of Size–Wuantized Electrons in Ultrafine Semiconductor Wire Structures", Japanese Journal of Applied Physics, vol. 19, No. 12, Dec. 1980, pp. L735–L738.

*Primary Examiner*—R. Bruce Breneman
*Assistant Examiner*—Ramahohan Rao Paladugu
*Attorney, Agent, or Firm*—Robert M. Trepp

[57] ABSTRACT

An undoped GaAs layer is epitaxially grown on a substrate in a crystal growth device. An undoped $Al_xGa_{1-x}As$ layer is then epitaxially grown to form an undoped hetero-junction structure. After this, a sample is transferred to a focused ion beam (FIB) apparatus. A dopant ion beam is focused and implanted into the $Al_xGa_{1-x}As$ layer in a dot-like or wire-like pattern so that it does not extend to the undoped GaAs layer or channel layer, and a zero- or one-dimensional carrier gas 8 is generated in the channel layer. The invention allows maskless ion implantation, and makes the fabrication process much easier because quantum wires and dots are drawn, patterned or formed directly by ion implantation. In addition, no etching process is required, so quantum wires and quantum dots can be fabricated precisely. Furthermore, since there is no influence of the impurity scattering and damage by ion implantation in the channel where electrons and holes are transported, high mobility is obtained and a high-speed device can be fabricated. The invention overcomes the problem of crystal damage in prior processes that required chemical etching and ion implantation.

9 Claims, 7 Drawing Sheets

METHOD OF FABRICATING A SEMICONDUCTOR DEVICE USING QUANTUM DOTS OR WIRES

This is a divisional of application Ser. No. 08/172,446, filed Dec. 22, 1993 now U.S. Pat. No. 5,479,027.

BACKGROUND OF THE INVENTION

1. Field of the Invention

This invention relates to a semiconductor device that contains zero- or one-dimensional carrier gases, and its fabrication method.

2. Background of the Invention

In a super thin film structure or one-dimensional quantum well structure, the dimensions may be equal to the de Broglie wavelength of a conduction electron. The super thin film structure may be fabricated by depositing different types of semiconducting thin-film materials in alternation, various physical properties that have not been seen in most previous semiconductors are being found. In a one-dimensional quantum well structure, a carrier that is an electron or a hole has two degrees of freedom and is called a two-dimensional carrier gas. The one-dimensional quantum well structure has also been applied to electronic devices, such as the semiconductor laser and the high electron mobility transistor, and has begun to exert a strong influence on industry.

The multidimensional quantum well structure has also been widely studied recently. In a two-dimensional quantum well structure (generally called a quantum wire) and a three-dimensional quantum well structure (generally called a quantum box or a quantum dot), the carrier has one and zero degrees of freedom, respectively. Thus, it is called a one-dimensional carrier gas and a zero-dimensional carrier gas, respectively. In the multidimensional quantum well structure, the development of a laser diode with narrower spectra and lower threshold is forecasted, because the distribution of the density of the states for the carrier is different from that of the one-dimensional quantum well structure. Details, may be found in the publications by (1) Arakawa and A. Yariv, IEEE J. Quantum Electron QE-22, 1887 (1986) and (2) M. Asada, Y. Miyamoto, and Y. Suematsu, IEEE J. Quantum Electron, QE-22, 1915 (1986).

Furthermore, in the two-dimensional quantum well (quantum wire), high electron (hole) mobility brought about by the simplification of the scattering mechanism is predicted, and the development of a high performance electronic device is expected. Examples may be found in the publication H. Sakaki, Jpn. J. Appl. Phys. Vol. 19, L735 (1980).

Several methods for fabricating a multidimensional quantum well structure have been proposed. The publication by H. Temkin, G. J. Dolan, M. B. Panish, and S. N. G. Chu, Appl. Phys. Lett. Vol. 50, 413 (1987) discloses a combination of lithography and physical and chemical etching. In addition, the publication by T. Fukui, S. Ando, Y. Tokura, and T. Toriyama, Appl. Phys. Lett. Vol. 58, 2018 (1991) discloses a selective method of growing a crystal face. The publication by F. Wakaya, T. Kakuta, Y. Takagaki, Y. Yuba, S. Takaoka, K. Murase, T. Shiokawa, K. Gamo, and S. Namba, in J. Vac. Sci. Technol. Vol. B8, 1794 (1990) discloses a method of modulating a structure by means of an electric field. The publication by Y. Hirayama, S. Tarucha, Y. Suzuki, and H. Okamoto, in Phys. Rev. Vol. B37, 2774 (1988) propose a method for keeping a GaAs region as a quantum wire by alloying the ion-implanted region, using a thermal treatment of the irradiated area in which a Ga focused ion beam (FIB) is directed onto the GaAs—AlGaAs quantum well structure in a striped pattern. However, those methods have the disadvantages of requiring many processes and of being complicated. Moreover, a desired region cannot be fabricated with accurate dimensions because of the limitations of etching technology. Furthermore, in the method shown in Japanese patent document JA PUPA No. 62-134978, there is a problem that part of the crystal is damaged even in the region remaining as a quantum wire, because the portions in which the ions are implanted by using FIB and the portions around it generally sustain widespread irradiation damage.

In JA PUPA No. 62-134978, a method is disclosed drawing a carrier supply region first by maskless ion implantation and then by growing a crystal layer on that region and generating a carrier gas in that layer. However, in this method it is difficult to grow a high-quality crystal layer on a crystal damaged by ion implantation. It is thought that this layer would influence the performance of a semiconductor device to be fabricated. In addition, the above publication does not disclose a method for generating a zero- or one-dimensional carrier gas.

SUMMARY OF THE INVENTION

In accordance with the present invention, a device and method for fabricating a semiconductor device is described by epitaxially growing an undoped hetero-junction structure (GaAs/Al$_x$Ga$_{1-x}$As or Si$_{1-y}$Ge$_y$/Si, for example) on a semi-insulating substrate (a semi-insulating GaAs substrate or semi-insulating Si substrate, for example) to form a crystalline device. The narrower bandgap semiconductor layer (a GaAs layer or Si$_{1-y}$Ge$_y$ layer, for example, hereinafter called the inner layer), which will be a channel layer, is located on the substrate side.

Next, the process includes the steps of transferring a sample into an FIB chamber, implanting a dot-like or wire-like pattern of dopant ions into the wider bandgap semiconductor layer (an undoped Al$_x$Ga$_{1-x}$As layer or undoped Si layer, for example, hereinafter called the surface layer), forming an n-type electron supply layer or p-type hole supply layer, and forming a zero- or one-dimensional electron gas or hole gas in the channel layer. If the Al$_x$Ga$_{1-x}$As layer is exposed, the sample must be transferred in a vacuum to the focused ion beam (FIB) apparatus. However, if a cap layer (a GaAs cap layer, for example) for preventing oxidation is grown, it is not necessary to transfer the sample in a vacuum, and the process thus becomes easier. The cap layer is grown after the formation of an undoped hetero-junction. To prevent the channel layer from being damaged, or influenced by impurity scattering, the ions must not extend to the channel layer but must approach it closely enough for sufficient electrons and holes to be supplied.

The device and method, in accordance with the present invention, allows maskless ion implantation using FIB, and requires fewer processes for fabricating quantum wires and quantum dots. In addition, the accuracy of quantum-wire or quantum-dot pattern is improved because of the non-etching process. Since the dopant is implanted in the surface layer of a semiconductor layer that forms a hetero-junction structure, a zero- or one-dimensional carrier gas can be formed in the channel layer without causing any damage.

A molecular beam epitaxy (MBE) apparatus using a solid source or a gas source and a focused ion beam (FIB) apparatus, or a system combining both, may be used to fabricate the hetero-junction semiconductor thin-layer structure required for the invention. In addition, a metal-organic chemical-vapor deposition (MOCVD) apparatus or an atomic layer epitaxy (ALE) apparatus can be used in place of the MBE apparatus.

An object of the invention is to provide a method that facilitates fabrication of a semiconductor device containing a quantum wire or a quantum dot.

Another object of the invention is to provide a method for fabricating a high-performance semiconductor device containing a quantum wire or a quantum dot.

The invention also provides a semiconductor device that can be easily fabricated, and the contain a quantum wire or a quantum dot.

BRIEF DESCRIPTION OF THE DRAWING

These and other features, objects, and advantages of the present invention will become apparent upon a consideration of the following detailed description of the invention when read in conjunction with the drawing in which.

DESCRIPTION OF THE PREFERRED EMBODIMENTS

Since FIGS. 1 to 7 correspond to FIGS. 8 to 14; the figures will be explained in parallel below.

Figure 1:
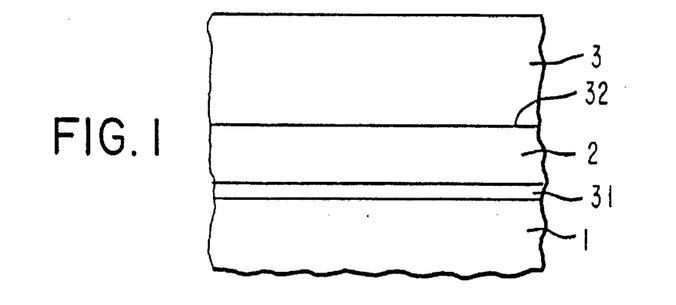
FIG. 1 is a cross-section view of a semiconductor device for explaining a first process step of the first embodiment of the invention.
Figure 8:
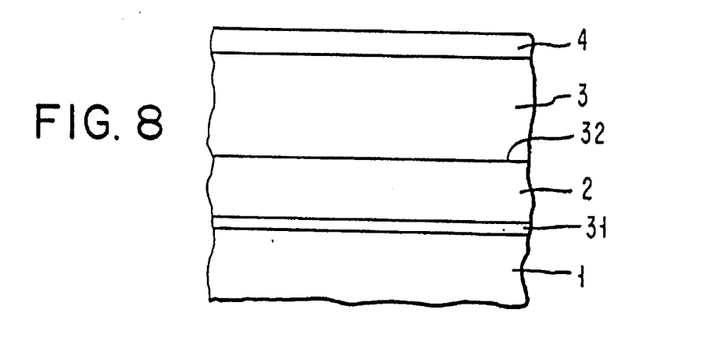
FIG. 8 is a cross-section view of a semiconductor device for explaining a first process step of the second embodiment of the invention.

Referring to the drawing and in particular to FIGS. 1 and 8, a semi-insulating GaAs single crystal substrate 1 is placed on an MBE apparatus and an undoped GaAs channel layer 2 is epitaxially grown on that substrate until its thickness is about 600 to 1,000 nanometers. The undoped GaAs channel layer 2 can be grown after epitaxial growth of an undoped GaAs buffer layer 31 with a thickness of about 200 to 300 nanometers on the substrate. Next, an undoped $Al_xGa_{1-x}As$ layer 3 is epitaxially grown until its thickness is about 50 to 200 nanometers, to form a $GaAs/Al_xGa_{1-x}As$ hetero-junction structure 32. In this case, x can be selected within the range of 0.1 to 0.7. In this specification, a hetero-junction structure that consists of two layers, A and B, with layer A located on the substrate side (for example, $GaAs/Al_xGa_{1-x}As$) will be described as A/B.

The series of layer formations 31, 2 and 3 by the MBE apparatus can be stopped on completion of the $Al_xGa_{1-x}As$ layer 3, as shown in FIG. 1. Alternatively, an undoped GaAs cap layer 4 with a thickness of about 10 nanometers for preventing oxidation can be further grown on the $Al_xGa_{1-x}As$ layer 3.

In FIGS. 2–21 like references are used for functions corresponding to the apparatus of FIG. 1 or of an earlier figure.

Figure 2:
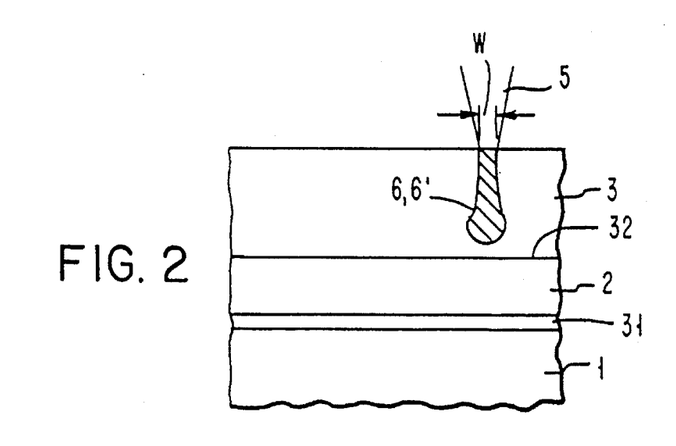
FIG. 2 is a cross-section view of a semiconductor device for explaining a second process step of the first embodiment of the invention.
Figure 9:
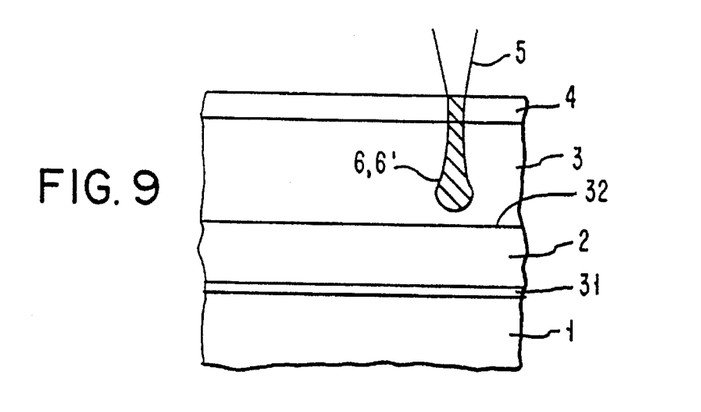
FIG. 9 is a cross-section view of a semiconductor device for explaining a second process step of the second embodiment of the invention.

Referring to FIGS. 2 and 9, the semi-insulating GaAs substrate 1, on which a hetero-junction structure has been grown, is transferred in a vacuum and placed in a focused ion beam (FIB) apparatus. Samples having an undoped GaAs cap layer 4 for preventing oxidation shown in FIG. 8 need not be transferred in a vacuum. Next, a beam 5 of n-type dopant ions, such as Si ions, or of p-type dopant ions, such as Be ions and Mg ions, is focused and implanted into the surface of a sample on which a quantum wire or quantum dot is to be drawn, patterned or formed. In fabricating a quantum wire, ions are implanted in a wire shape, and in fabricating a quantum dot, ions are implanted in dot shapes and an n-type electron supply layer 6 or a p-type hole supply layer 6' is formed. The depth of ion implantation in the $Al_xGa_{1-x}As$ layer 3 has to be determined so that the dopant ions do not extend to the GaAs channel layer 2, and so that the carrier supply region 6 (or 6') is located close enough to the channel layer 2 to allow a sufficient supply of electrons or holes. Specifically, it should be determined so that the end of the carrier supply region 6 (or 6') is about 10 to 80 nanometers away from the interface hetero-junction structure 32, between the GaAs channel layer 2 and the $Al_xGa_{1-x}As$ layer 3.

The ion-implantation conditions of the focused ion beam apparatus at this time are as follows:

Acceleration voltage: 10–300 keV; Beam current: 3–500 pA; Dose: Approx. $10^{11}$–$10^{15}$ cm$^{-2}$; and Beam size: 2–50 nm width.

The beam size corresponds to the width W of the upper section of the region 6 (6').

Figure 3:
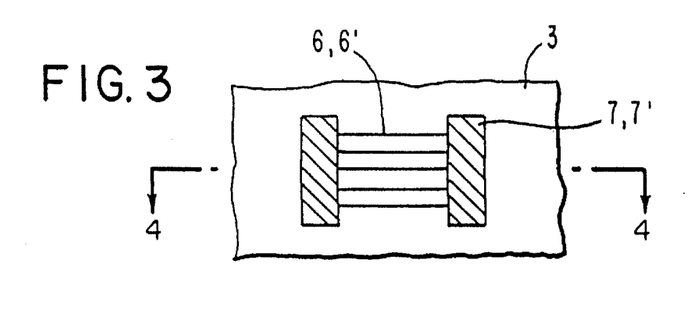
FIG. 3 is a plan view of a semiconductor device for explaining a third process step of the first embodiment of the invention.
Figure 4:
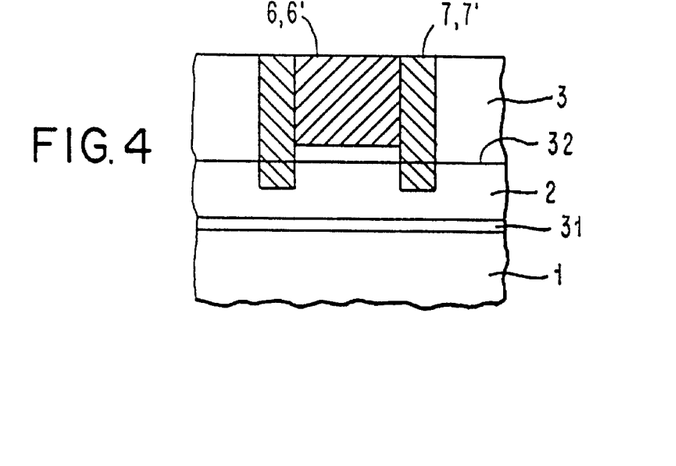
FIG. 4 is a cross-section view of a semiconductor device for explaining a third process step of the first embodiment of the invention.
Figure 10:
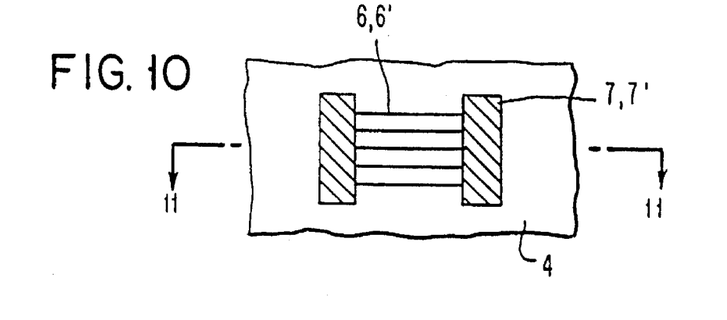
FIG. 10 is a plan view of a semiconductor device for explaining a third process step of the second embodiment of the invention.
Figure 11:
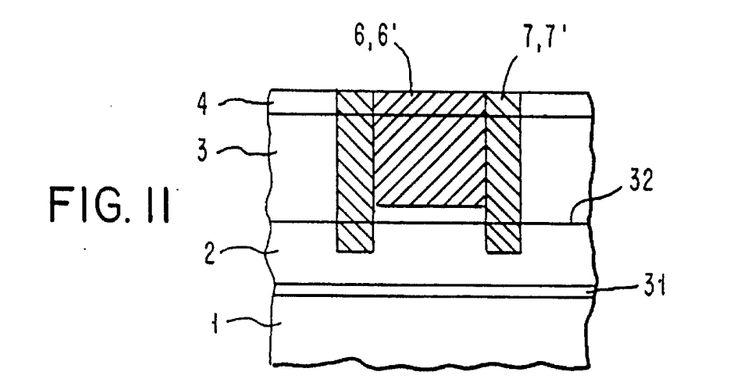
FIG. 11 is a cross-section view of a semiconductor device for explaining a third process step of the second embodiment of the invention.
Figure 12:
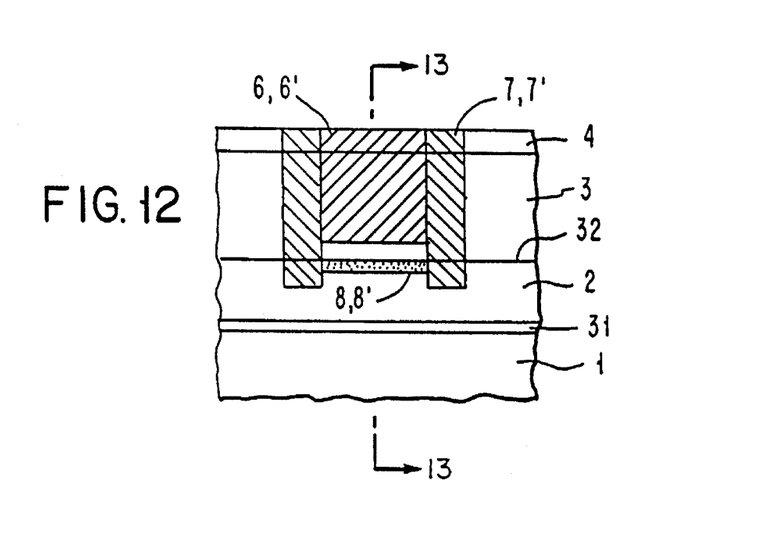
FIG. 12 is a cross-section view of a semiconductor device for explaining a fourth process step of the second embodiment of the invention.

Referring to FIGS. 3 and 4, and 10 and 11, quantum wires and quantum dots can be applied to various electronic devices. A process for fabricating a Field Effect Transistor (FET) using a quantum wire as a channel will be described below. FIGS. 3 and 10 are plan views. FIG. 4 is a cross-section view along the line 4—4 of FIG. 3 and FIG. 11 is a cross-section view along the line 11—11 of FIG. 10.

The beam size is widened at both ends of the wire-like n-type electron supply layer 6 or p-type hole supply layer 6'. Dopant ions are implanted in a two-dimensional state so that they extend to the GaAs channel layer 2. An n-type electron supply layer 7 or p-type hole supply layer 7' is formed. As specific dimensional examples, the length of the wire-like region 6 or region 6' might be 0.1 to 1.0 μm and the length of each side of the two-dimensional ion-implantation region at both of its sides might be 0.2 to 10 μm.

Referring to FIGS. 5 and 6, and 12 and 13, the semi-insulating GaAs substrate 1 is transferred in a vacuum and is placed in the MBE apparatus again. The undoped GaAs cap layer 4 is then grown to a thickness of about 10 nanometers, to prevent oxidation on the $Al_xGa1-xAs$ carrier layer 3. This process is not required if the undoped GaAs cap layer 4 for preventing oxidation has already been deposited, as shown in FIG. 11.

Figure 5:
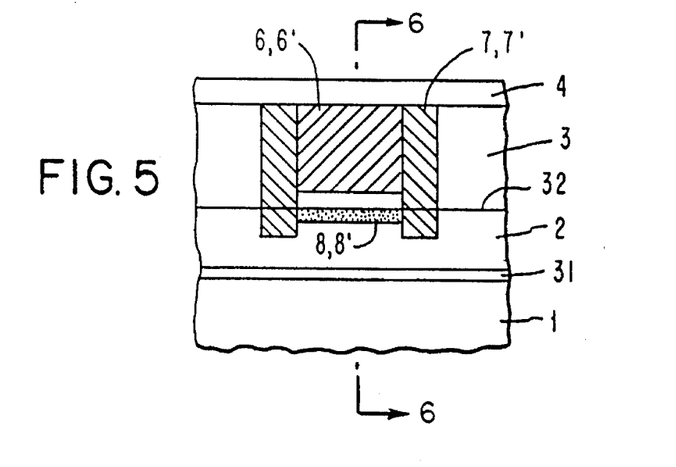
FIG. 5 is a cross-section view of a semiconductor device for explaining a fourth process step of the first embodiment of the invention.
Figure 6:
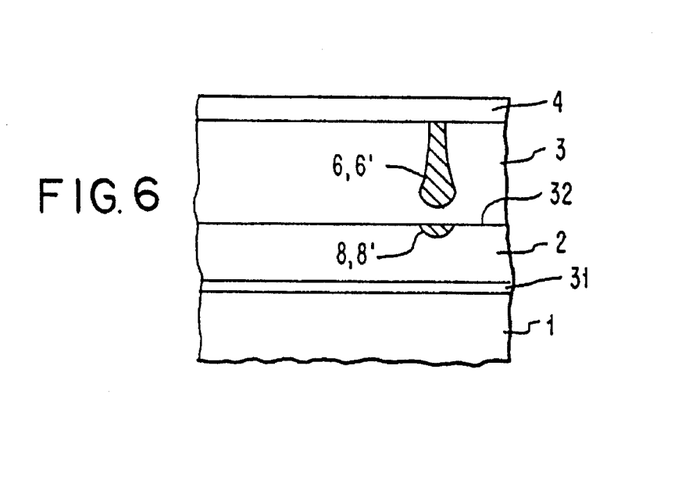
FIG. 6 is a cross-section view of a semiconductor device for explaining a fourth process step of the first embodiment of the invention.
Figure 13:
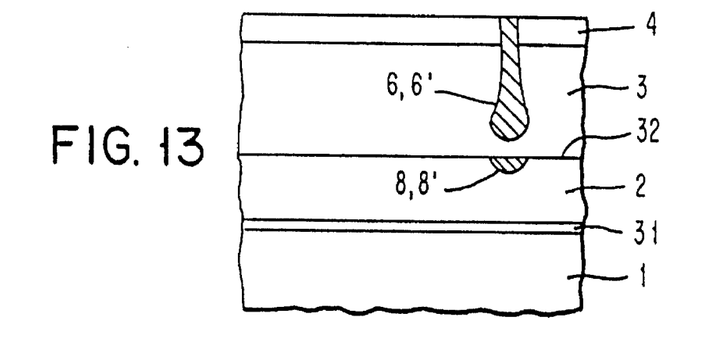
FIG. 13 is a cross-section view of a semiconductor device for explaining a fourth process step of the second embodiment of the invention.

Next, an annealing process is carried out to activate impurities. The n-type electron supply region 6 (or p-type hole supply region 6') is activated, and a zero- or one-dimensional electron gas 8 (or hole gas 8') is generated in the undoped GaAs channel layer 2. The region containing the carrier gas 8 (or 8') forms a quantum wire and functions as an FET channel. FIG. 6 is a cross-section view along the line 6—6 of FIG. 5 and FIG. 13 is a cross-section view along the line 13—13 of FIG. 12.

In general, merely forming region 6 (or 6') does not ensure that the carriers to be supplied to the channel layer 2 is sufficiently dense. Therefore, an annealing process is carried out to generate sufficient carriers in the region 6 (or 6'). Those carriers are then supplied to the channel 2. The annealing temperature and time are about 100 C–800 C and about 1–60 minutes, respectively. These values are determined by the dose and the distance between the end of the region 6 (or 6') and the channel layer 2.

Figure 7:
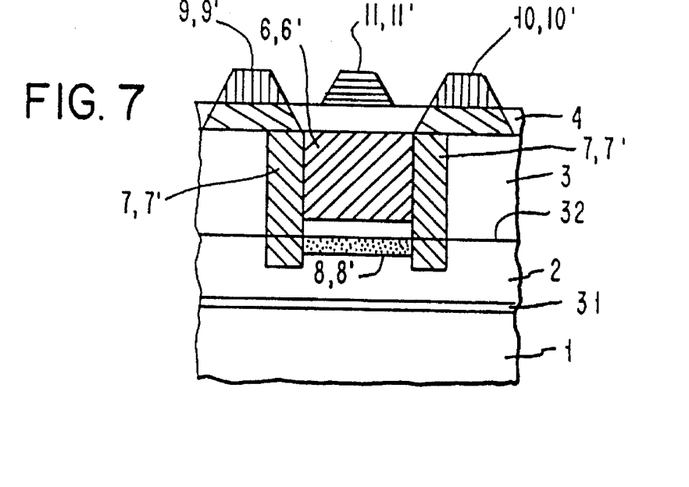
FIG. 7 is a cross-section view of a semiconductor device for explaining a fifth process step of the first embodiment of the invention.
Figure 14:
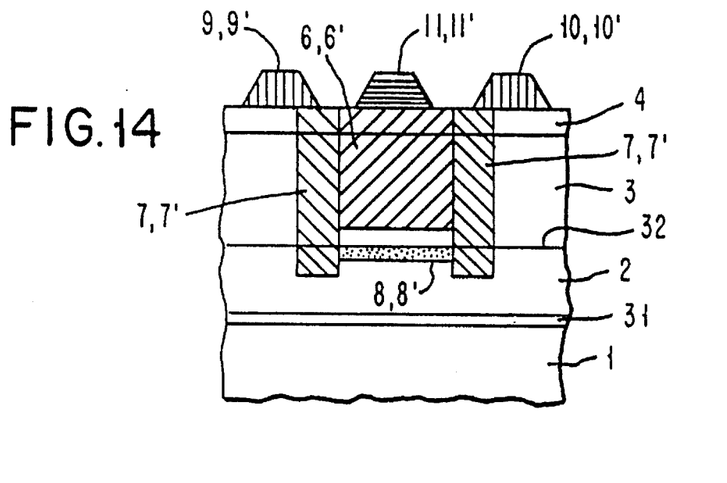
FIG. 14 is a cross-section view of a semiconductor device for explaining a fifth process step of the second embodiment of the invention.

Referring to FIGS. 7 and 14, if the channel layer 2 contains an electron gas 8—that is, in the case of the n-channel device—applying a general technique allows the formation of the Au Ge/Au source electrode 9 and drain electrode 10. The Au Zn/Au gate electrode 11 is also formed to create a depletion region. Similarly, if the channel layer 2 contains hole gas 8'—that is, in the case of a p-channel device—the Au Zn/Au source electrode 9', the drain electrode 10', and the Au Ge/Au gate electrode 11' are formed. After this, conventional wiring is carried out to complete the device. In FIG. 7, region 7 (or 7') and region 6 (or 6') are connected conductively with electrodes 9 and 10 by the diffusion of electrode materials.

Values as high as $10^6$–$10^7$ cm$^2$/Vs were obtained at 4.2K when the electron mobility of an n-channel device fabricated by this method was measured. The width of the formed quantum wire is thought to be less than 20 to 30 nanometers.

Figure 15:
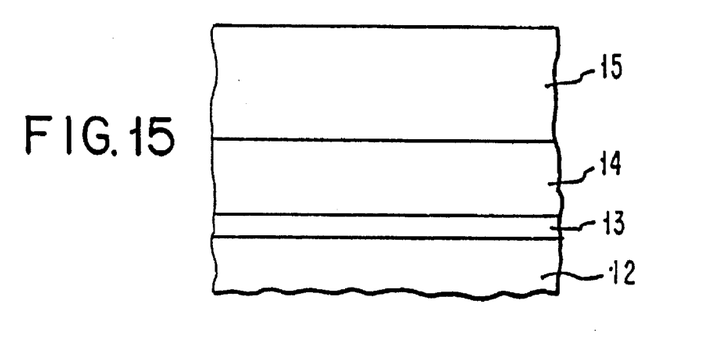
FIG. 15 is a cross-section view of a semiconductor device for explaining a first process step of the third embodiment of the invention.

Refer to FIG. 15 an example of an Si system is shown.

A semi-insulating Si substrate 12 is placed on an MBE apparatus and an undoped Si layer 13 is epitaxially grown on that substrate until its thickness is about 200 to 300 nanometers. Next, the undoped $Si_{1-y}Ge_y$ channel layer 14 is epitaxially grown until its thickness is about 50 to 500 nanometers. Furthermore, the undoped Si layer 15 is epitaxially grown until its thickness is about 100 to 200 nanometers, to form a $Si_{1-y}Ge_y$/Si hetero-junction structure. y can be selected within the range from 0.05 to 0.5.

Figure 16:
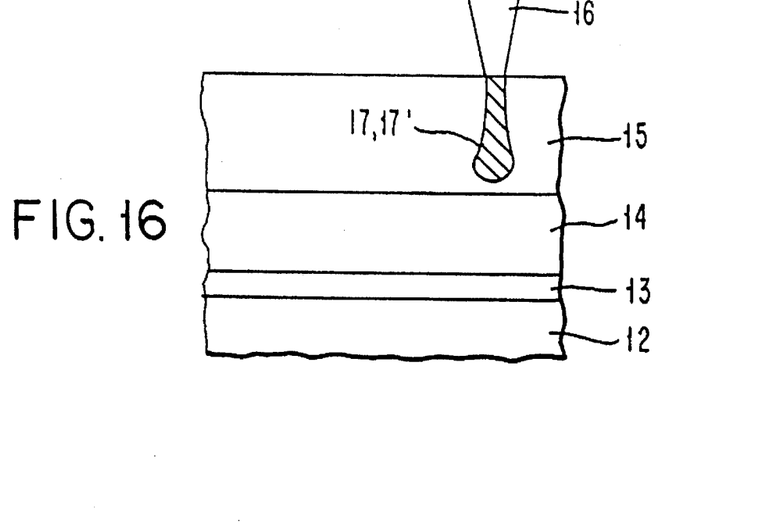
FIG. 16 is a cross-section view of a semiconductor device for explaining a second process step of the third embodiment of the invention.

Referring to FIG. 16, the semi-insulating Si substrate 12, in which a hetero-junction structure was grown, is transferred and placed in the FIB apparatus. In an Si system, it is not necessary to transfer the substrate in a vacuum even if there is no cap layer. The beam 16 of n-type dopant ions, such as Sb ions and P ions, or of p-type dopant ions, such as B ions and Ga ions, is focused and implanted into the surface of a sample in which a quantum wire or quantum dot is to be drawn. In fabricating a quantum wire, ions are implanted in a wire shape, and in fabricating a quantum dot, ions are implanted in a dot shape and an n-type electron supply layer 17 or a p-type hole supply layer 17' is formed. The depth of ion implantation in the Si layer 15 has to be determined so that the dopant ions do not extend to the $Si_{1-y}Ge_y$ channel layer 2, and so that the carrier supply region 17 (or 17') is located close enough to the channel layer 2 to allow a sufficient supply of electrons or holes. Specifically, it should be determined so that the bottom of the carrier supply region 17 (or 17') is about 10 to 80 nanometers away from the interface between the $Si_{1-y}Ge_y$ channel layer 14 and Si layer 15.

The ion-implantation conditions of the focused ion beam apparatus at this time are as follows::

Acceleration voltage: 10–300 keV; Beam current: 3–500 pA; Dose: Approx. $10^{11}$$10^{15}$ cm$^{-2}$; and Beam size: 2–50 nm width.

Figure 17:
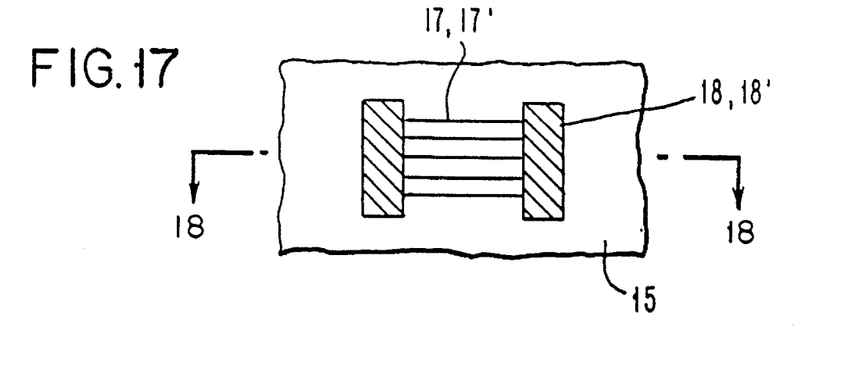
FIG. 17 is a plan view of a semiconductor device for explaining a third process step of tile third embodiment of the invention.
Figure 18:
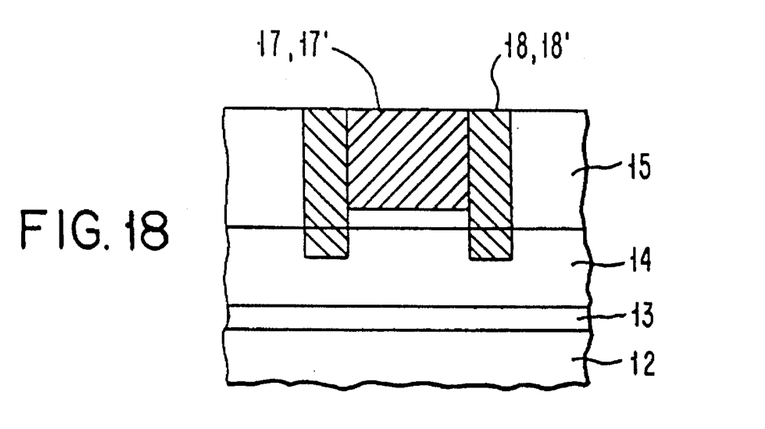
FIG. 18 is a cross-section view of a semiconductor device for explaining a third process step of the third embodiment of the invention.

Referring to FIGS. 17 and 18, process for fabricating an FET using a quantum wire as a channel will be described below. FIG. 17 is a plan view. FIG. 18 is a cross-section view along the line 18—18 of FIG. 17.

The beam size of beam 16 is widened at both ends of the wire-like n-type electron supply layer 17 or the p-type hole supply layer 17'. Dopant ions are implanted in a two-dimensional state so that they extend to the $Si_{1-y}Ge_y$ channel layer 14. An n-type electron supply layer 18 or a p-type hole supply layer 18' is formed. As specific dimensional examples, the length of the wire-like region 17 or region 17' might be 0.1 to 1.0 μm and the length of each side of the two-dimensional ion-implantation region 18 or region 18' at both of its sides might be 0.2 to 10 μm.

Figures 19, 20:
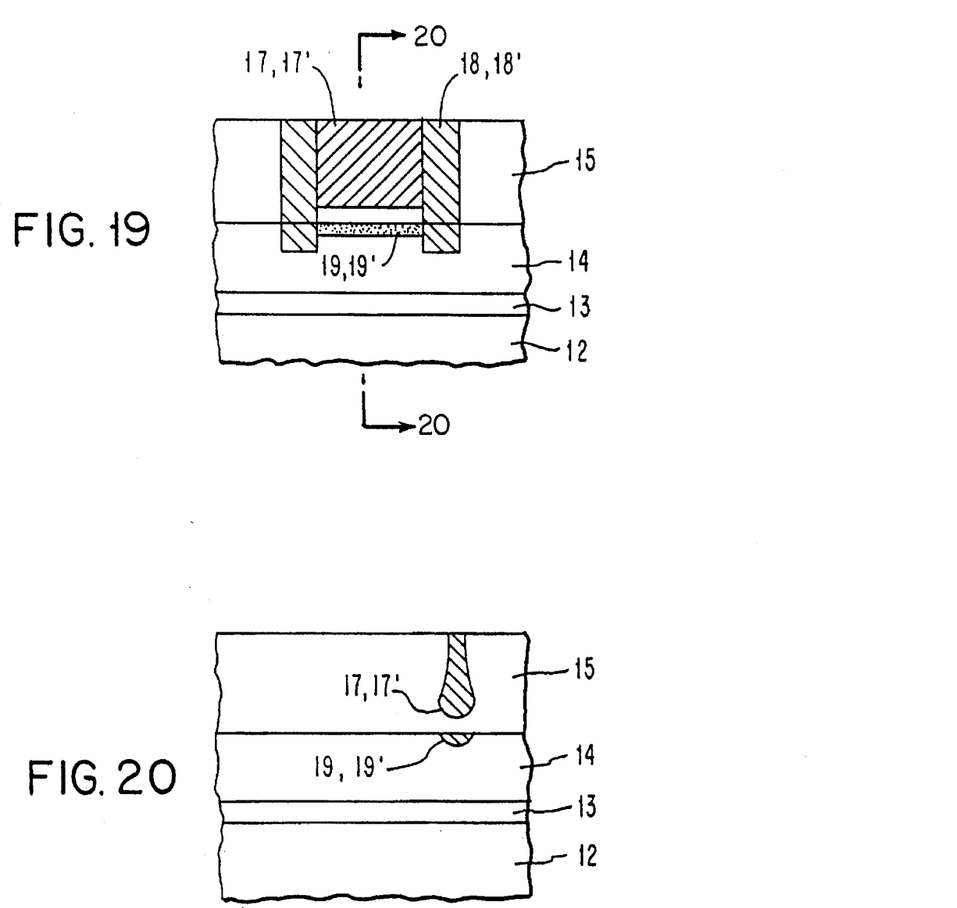
FIG. 19 is a cross-section view of a semiconductor device for explaining a fourth process step of the third embodiment of the invention.
FIG. 20 is a cross-section view of a semiconductor device for explaining a fourth process step of the third embodiment of the invention.

Referring to FIGS. 19 and 20, an annealing process is carried out to activate impurities. The n-type electron supply region 17 (or p-type hole supply region 17') is activated, and a zero- or one-dimensional electron gas 19 (or hole gas 19') is generated in the undoped $Si_{1-y}Ge_y$ channel layer 14. The heating temperature and time should be determined according to a standard similar to that used for a GaAs system. The region containing the carrier gas 19 (or 19') forms a quantum wire and functions as an FET channel. FIG. 20 is cross-section view along the line 20—20 of FIG. 19. FIG. 20 shows a quantum wire schematically.

Figure 21:
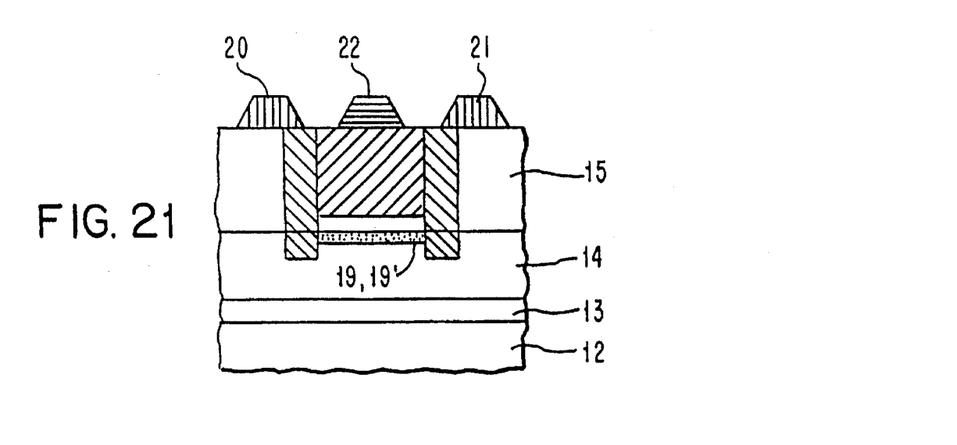
FIG. 21 is a cross-section view of a semiconductor device for explaining a fifth process step of the third embodiment of the invention.

Referring to FIG. 21, applying a general technique allows the formation of an Al Si/Al or Au source electrode 20 and a drain electrode 21. If the channel layer 14 contains an electron gas 19—that is, in the case of the n-channel device—the Al Ga/Al or the Au Ga/Au gate electrode 22 is formed to create a depletion region. If the channel layer 14 contains a hole gas 19'—that is, in the case of a p-channel device—an Al Sb/Al or Au Sb/Au gate electrode 22 is formed. After this, conventional wiring is carried out to complete the device.

Values as high as $10^5 10^6$ cm$^2$/Vs were obtained at 4.2K when the electron mobility of an n-channel device fabricated by this method was measured. The width of the formed quantum wire is thought to be less than 20 to 30 nanometers.

Thus far, the invention has been explained in accordance with specific embodiments; however, it can be applied without being thus limited. For example, InGaAs/GaAs, InGaP/AlInP, and GaInP/AlGaInP can be used as heterojunction structures. In addition, a process for growing the buffer layer 13 can be omitted in the Si system device fabrication process. Furthermore, even though many examples for forming an electrode with two metal layers are shown, it is possible to form an electrode with only an alloy layer.

The invention allows maskless ion implantation, and makes the fabrication process much easier because quantum wires and dots are drawn directly by ion implantation by a focused ion beam apparatus. In addition, no etching process is required, so quantum wires and dots can be fabricated accurately. Furthermore, since there is no influence of the impurity scattering, and damage by ion implantation in the channel where electrons and holes are transported, high mobility is obtained and a high-speed device can be fabricated.

While there has been described and illustrated a semiconductor device containing a quantum wire or a quantum dot and the method making which allows maskless ion implantation using, for example, the focused ion beam (FIB) apparatus, it will be apparent to those skilled in the art that modifications and variations are possible without deviating from the broad scope of the invention which shall be limited solely by the scope of the claims appended hereto.

Having thus described my invention, what I claim as new and desire to secure by Letters Patent is:

1. A method for fabricating a semiconductor device that contains a carrier gas selected from the group consisting of a one-dimensional carrier gas and a zero-dimensional carrier gas, comprising the steps of:

forming a substantially undoped first semiconductor layer;

forming a substantially undoped second semiconductor layer on said first semiconductor layer, the bandgap of said second semiconductor layer being wider than that of said first semiconductor layer; and implanting a pattern selected from the group consisting of a zero-dimensional carrier gas pattern and a one-dimensional carrier gas pattern of dopant ions into said second semiconductor layer from the surface thereof opposite said first semiconductor layer, and to a depth such that the dopant ions are located away from said first semiconductor layer by a distance whereby carriers are supplied to said first semiconductor layer.

2. The method of claim 1 wherein a region containing the one-dimensional carrier gas is a quantum wire.

3. The method of claim 1 wherein a region containing the zero-dimensional carrier gas is a quantum dot.

4. The method of claim 1 wherein said step of implanting includes setting the bottom of the ion-implanted region to be about 10 to about 80 nanometers away from the interface between said first and second semiconductor layers.

5. The method of claim 1 wherein said ions are implanted by using an focused ion beam (FIB) apparatus.

6. The method of claim 1 wherein after the step of implanting, annealing the resulting structure in a thermal process for activating the impurities.

7. The method of claim 1 further including the step of forming a drain and source region on respective sides of said implantation into said first semiconductor layer.

8. The method of claim 1 further including the step of forming a gate electrode over said implantation to control the channel formed in said first semiconductor layer.

9. The method of claim 1 further including the steps of forming a field effect transistor incorporating said carriers in said first semiconductor layer as its channel.

\* \* \* \* \*